United States Patent
Ahn et al.

(10) Patent No.: US 9,018,651 B2
(45) Date of Patent: Apr. 28, 2015

(54) OPTICAL DEVICE INTEGRATED WITH DRIVING CIRCUIT AND POWER SUPPLY CIRCUIT, METHOD FOR MANUFACTURING OPTICAL DEVICE SUBSTRATE USED THEREIN, AND SUBSTRATE THEREOF

(71) Applicant: Point Engineering Co., Ltd., Asan-si, Chungcheongam-do (KR)

(72) Inventors: Bum Mo Ahn, Yongin-si (KR); Ki Myung Nam, Cheonan-si (KR); Seung Ho Park, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/365,408

(22) PCT Filed: Oct. 4, 2012

(86) PCT No.: PCT/KR2012/008052
§ 371 (c)(1),
(2) Date: Jun. 13, 2014

(87) PCT Pub. No.: WO2013/089341
PCT Pub. Date: Jun. 20, 2013

(65) Prior Publication Data
US 2014/0374783 A1    Dec. 25, 2014

(30) Foreign Application Priority Data

Dec. 15, 2011 (KR) .................. 10-2011-0135572

(51) Int. Cl.
*H01L 33/00* (2010.01)
*H01L 27/15* (2006.01)
(Continued)

(52) U.S. Cl.
CPC ............ *H01L 27/15* (2013.01); *H05B 33/0803* (2013.01); *H05B 33/0806* (2013.01);
(Continued)

(58) Field of Classification Search
USPC ........................................... 257/93
See application file for complete search history.

(56) References Cited

U.S. PATENT DOCUMENTS

| 6,740,903 B2 | 5/2004 | Isoda |
| 6,777,659 B1 * | 8/2004 | Schwarte .................. 250/208.1 |

(Continued)

FOREIGN PATENT DOCUMENTS

| JP | 09-055535 A | 2/1997 |
| JP | 09-055535 A | 2/1997 |

(Continued)

OTHER PUBLICATIONS

Korean Intellectual Property Office, Notice of Allowance, 3 pages, dated Oct. 11, 2013.

(Continued)

*Primary Examiner* — Thao P Le
(74) *Attorney, Agent, or Firm* — Sunstein Kann Murphy & Timbers LLP

(57) ABSTRACT

The present invention relates to an optical device integrated with a driving circuit and a power supply circuit, a method for manufacturing an optical device substrate used therein, and a substrate thereof, which are capable of reducing the overall size and facilitating the handling and management thereof by mounting a plurality of optical elements, driving circuits thereof, and power supply circuits thereof on a single substrate for an optical device having a vertical insulating layer. The objective of the present invention is to provide the optical device integrated with the driving circuit and the power supply circuit, the method for manufacturing the optical device substrate used therein, and the substrate thereof which are capable of reducing the overall size and facilitating the handling and the management thereof by mounting the plurality of optical elements, the driving circuits thereof, and the power supply circuits thereof on the single substrate for the optical device having the vertical insulating layer.

11 Claims, 15 Drawing Sheets

(51) Int. Cl.
*H05B 33/08* (2006.01)
*H01L 25/16* (2006.01)
*H01L 33/62* (2010.01)
*H01L 33/64* (2010.01)
*H01L 25/075* (2006.01)

(52) U.S. Cl.
CPC ........... *H01L25/0753* (2013.01); *H01L 25/167* (2013.01); *H01L 33/62* (2013.01); *H01L 2224/48091* (2013.01); *H01L 2224/48465* (2013.01); *H01L 33/005* (2013.01); *H01L 33/64* (2013.01)

(56) References Cited

U.S. PATENT DOCUMENTS

2003/0193083 A1    10/2003    Isoda
2004/0135952 A1*   7/2004     Kurashina et al. ............ 349/139
2004/0195581 A1    10/2004    Isoda
2006/0033112 A1    2/2006     Isoda

FOREIGN PATENT DOCUMENTS

JP    2003-309292 A    10/2003
JP    2007-036132 A    2/2007
KR    10-1086014 B1    11/2011

OTHER PUBLICATIONS

Korean Intellectual Property Office, Office Action, 5 pages, dated Mar. 18, 2013.

International Searching Authority, International Search Report—International Application No. PCT/KR2012/008052, 4 pages, dated Mar. 20, 2013.

\* cited by examiner

100'

OPTICAL DEVICE INTEGRATED WITH DRIVING CIRCUIT AND POWER SUPPLY CIRCUIT, METHOD FOR MANUFACTURING OPTICAL DEVICE SUBSTRATE USED THEREIN, AND SUBSTRATE THEREOF

TECHNICAL FIELD

The present invention relates to an optical device integrated with a driving circuit and a power supply circuit, a method of manufacturing an optical device substrate used therein, and a substrate thereof. More particularly, the present invention relates to an optical device integrated with a driving circuit and a power supply circuit, which is configured such that a plurality of optical elements, driving circuits thereof and power supply circuits thereof are mounted on a single substrate for an optical device having a vertical insulating layer, a method of manufacturing an optical device substrate used therein, and a substrate thereof.

BACKGROUND ART

Generally, a light emitting diode (LED) has attracted considerable attention as an environmentally friendly light source in various fields since it causes no pollution. Recently, the usage range of an LED has extended to various fields such as interior and exterior illumination, automobile head lights, and back-light units (BLUs) of displays, and thus an LED having high efficiency and excellent heat emission characteristics has been required. In order to obtain a high-efficiency LED, primarily, the raw material and structure of an LED must be improved, but, additionally, the raw material and structure of an LED package must also be improved.

High heat is generated from such a high-efficiency LED. Therefore, when high heat is not effectively discharged to the outside thereof, the temperature of the LED rises, and thus the characteristics thereof deteriorate, thereby reducing the lifetime thereof. For this reason, efforts have been made to effectively discharge the high heat emitted from a high-efficiency LED to the outside thereof.

Hereinafter, various kinds of elements emitting light, including an LED, are referred to as "optical elements", and various kinds of products including one or more optical elements are referred to as "optical devices".

FIGS. 1A to 1D are perspective views explaining a method of manufacturing a conventional optical device with respect to each process. First, as shown in FIG. 1A, in order to form a substrate 10 for mounting a conventional optical element, conductive plates 11, such as copper plates, having a predetermined thickness and insulating plates 12, such as glass plates or epoxy plates, having a predetermined thickness are alternately attached to each other in a plane direction, thus forming a laminate 13 (refer to FIG. 1B). Here, the attaching of the conductive plates 11 and the insulating plates 12 may be conducted by an adhesive or by thermo-compression bonding.

Next, as shown in FIG. 1B, when the laminate 13 is cut by a predetermined width in a direction perpendicular to the plane of the conductive plate 11, that is, in a vertical direction, a substrate 10, configured such that band-shaped conductive portions 10$a$ and insulating portions 10$b$ are alternately disposed, is obtained, as shown in FIG. 1C.

Next, as shown in FIG. 1D, LED chips 2 are disposed and mounted on each of the conductive portions (10$a$-①, 10$a$-②, 10$a$-③) of the substrate 10 in a matrix form having regular intervals, and wires 3 are drawn out from each row of the conductive portions (10$a$-①, 10$a$-②, 10$a$-③) and connected to the next row of the conductive portion 10$a$ to obtain an LED array. The obtained LED array is molded with a transparent molding resin to prepare a plate-shaped LED array.

Meanwhile, the prepared plate-shaped LED array is configured such that its rows are electrically connected in parallel to each other and its lines are electrically connected in series to each other. In this case, this plate-shaped LED array may be directly made into a product or may be made into a product after it is separated along a row or line or is separated with respect to each piece. Moreover, when this plate-shaped LED array directly is used, it may be mounted on a metal printed circuit board (PCB) or may be provided thereunder with a heat sink.

FIG. 2 is a schematic perspective view showing a conventional optical device including a plurality of optical elements. As shown in FIG. 2, for example, in order to drive the plate-shaped LED array 20 prepared by the method of FIG. 1, there are required a driving circuit including passive elements 30, such as a resistor and a condenser, and a driving IC 40 serving to supply static current to the plate-shaped LED array 20; and a power supply circuit 60 such as switching-mode power supply (SMPS). A conventional optical device is configured such that at least one of a driving circuit and a power supply circuit is separately provided and then connected to a plate-shaped LED array substrate 10 through a power cable 50. Therefore, the conventional optical device is problematic in that its total size becomes large and its treatment and control is not easy.

TECHNICAL SOLUTION

Technical Problem

Accordingly, the present invention has been devised to solve the above-mentioned problems, and an object of the present invention is to provide an optical device integrated with a driving circuit and a power supply circuit, wherein a plurality of optical elements, a driving circuit thereof and a power supply circuit thereof are all mounted on a single substrate having a vertical insulating layer, thus decreasing the total size of the optical device and allowing the optical device to be easily treated and controlled, a method of manufacturing an optical device substrate used therein, and a substrate thereof.

In order to accomplish the above object, an aspect of the present invention provides an optical device integrated with a driving circuit and a power supply circuit, including: a substrate including a plurality of transverse vertical insulating layers vertically penetrating the substrate in a transverse direction, wherein the substrate includes: an optical element substrate region including two or more of the plurality of transverse vertical insulating layers and mounted with a plurality of optical elements; and a driving circuit substrate region including at least one of the other transverse vertical insulating layers and mounted with a driving circuit element.

Here, the optical element substrate region may include at least one longitudinal vertical insulating layer vertically penetrating the substrate in a longitudinal direction.

The optical element substrate region may be configured such that at least one cavity for an optical element, including the vertical insulating layer, is formed to a predetermined depth from an upper surface thereof.

The driving circuit substrate region is configured such that at least one cavity for a driving circuit, including the vertical insulating layer, is formed to a predetermined depth from an upper surface thereof The optical device may further include a power supply circuit substrate attached to the lower surface of the driving circuit substrate region.

The optical device may further include a heat sink attached to the lower surface of the optical element substrate region.

Another aspect of the present invention provides a method of manufacturing a substrate for an optical device integrated with a driving circuit and a power supply circuit, including the steps of: (a) laminating a plurality of metal plates to function as a driving circuit substrate region mounted with a driving circuit and interposing an insulating layer between the metal plates; (b) laminating a plurality of metal plates to function as an optical element substrate region mounted with an optical element, the vertical length of the optical element substrate region being the same as that of the driving circuit substrate region, and interposing an insulating layer between the metal plates to form two optical element substrate blocks, facing the two optical element substrate blocks each other in a traverse direction, and then attaching the insulating layer onto the uppermost metal plate of the driving circuit substrate region; (c) laminating a metal plate to function as a substrate for connecting the optical element substrate, the horizontal and vertical lengths of the metal plate being the same as those of the metal plate for the driving circuit substrate, onto the uppermost metal plate of the optical element substrate region with the insulating layer disposed therebetween, thus preparing an intermediate product; and (d) vertically cutting the intermediate product to have a predetermined width in a length direction.

Still another aspect of the present invention provides a method of manufacturing a substrate for an optical device integrated with a driving circuit and a power supply circuit, including the steps of: (h) laminating a plurality of metal plates to function as a driving circuit substrate region mounted with a driving circuit and interposing an insulating layer between the metal plates; (i) laminating two metal plates to function as an optical element substrate region mounted with an optical element, the vertical length of the optical element substrate region being the same as that of the driving circuit substrate region, and interposing an insulating layer between the two metal plates, facing the two metal plates each other in a traverse direction, and then attaching the metal plates to each other in a multilayer fashion with the insulating layer disposed therebetween; (j) laminating a metal plate to function as a substrate for connecting the optical element substrate, the horizontal and vertical lengths of the metal plate being the same as those of the metal plate for the driving circuit substrate, onto the uppermost metal plate of the optical element substrate region with the insulating layer disposed therebetween, thus preparing an intermediate product; and (k) vertically cutting the intermediate product to have a predetermined width in a length direction.

Advantageous Effects

The optical device integrated with a driving circuit and a power supply circuit according to the present invention is advantageous in that the total size of the optical device can be reduced, and the optical device can be easily treated and controlled.

Figure 1A:
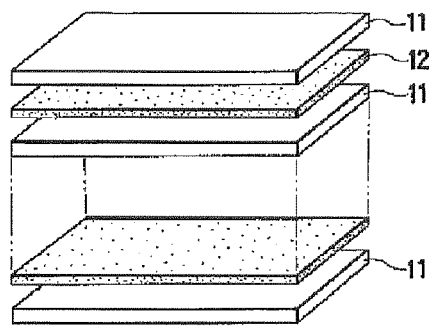
FIGS. 1A to 1D are perspective views explaining a method of manufacturing a conventional optical device with respect to each process.
Figure 1B:
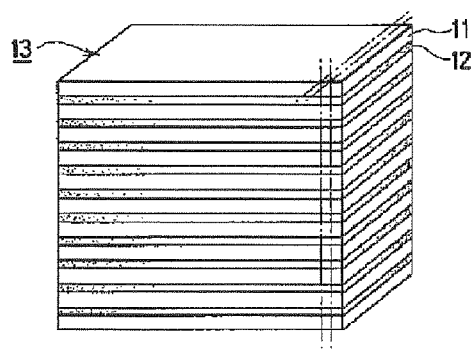
Figure 1C:
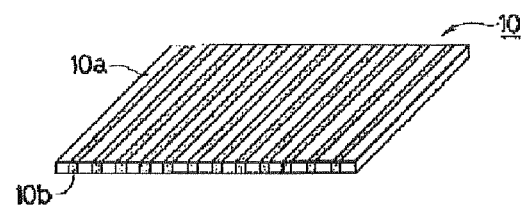
Figure 1D:
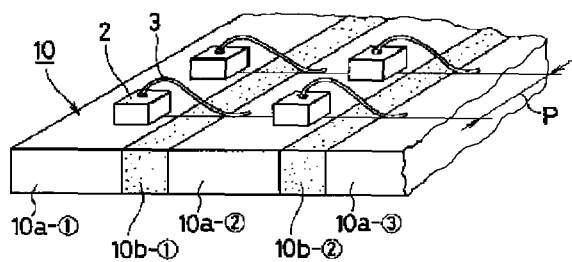
Figure 2:
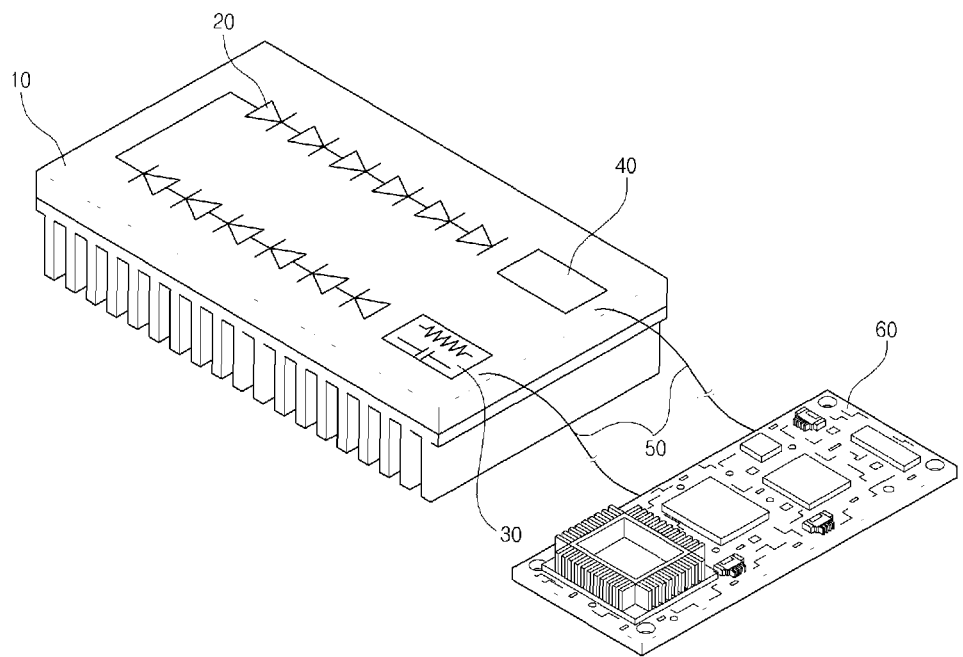
FIG. 2 is a schematic perspective view showing a conventional optical device including a plurality of optical elements.

DESCRIPTION OF THE REFERENCE NUMERALS IN THE DRAWINGS 100, 100': substrate for optical device
110: transverse vertical insulating layer
120: longitudinal vertical insulating layer
130: white paint layer
140: cavity for optical element
142: relative small-area region
144: relative large-area region
150: cavity for passive element
160: cavity for driving IC
170: metal plated layer
180, 190: groove
180, D1-D10: optical elements
182: wire
190, 192: sealant
R: resistor
C: condenser
U1: driving IC

MODE FOR INVENTION

Hereinafter, preferred embodiments of the present invention will be described in detail with reference to the accompanying drawing.

Figure 3:
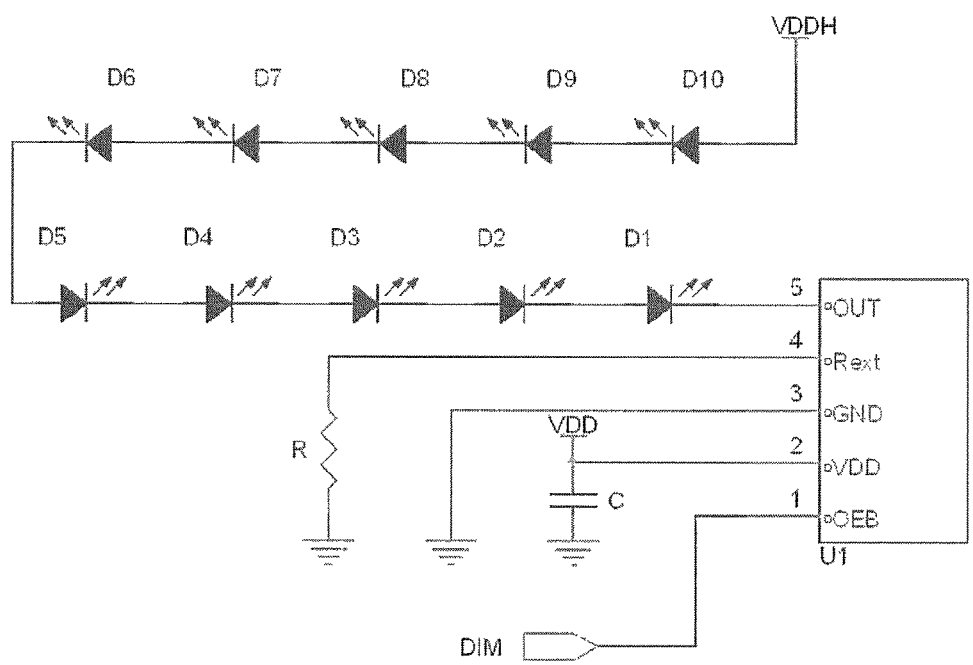
FIG. 3 is a circuit diagram of an optical device according to an embodiment of the present invention.

FIG. 3 is a circuit diagram of an optical device according to an embodiment of the present invention. As shown in FIG. 3, the optical device according to an embodiment of the present invention is configured such that ten optical elements (D1-D10), for example, ten LEDs each having a power consumption of 1 W, are serially connected to each other. The anode electrode of the optical element array composed of the above-mentioned ten serially-connected optical elements is connected with a direct current power supply (VDDH), and the cathode electrode thereof is connected with an output terminal (OUT) of a driving IC (U1) for driving the optical element array with static current.

Meanwhile, the external resistance terminal ($R_{ext}$) of the driving IC (U1) is connected with an external resistor (R), the ground terminal thereof is grounded, and the power supply terminal (VDD) thereof is connected to a condenser (C) to allow power to be applied thereto. The driving IC (U1) may be additionally provided with an OEB terminal receiving an external illumination control command. The circuit configuration of the optical device, shown in FIG. 3, is only an example, and may be changed depending on the kind of driving IC, the number of optical elements or the connection state of optical elements.

Figure 4:
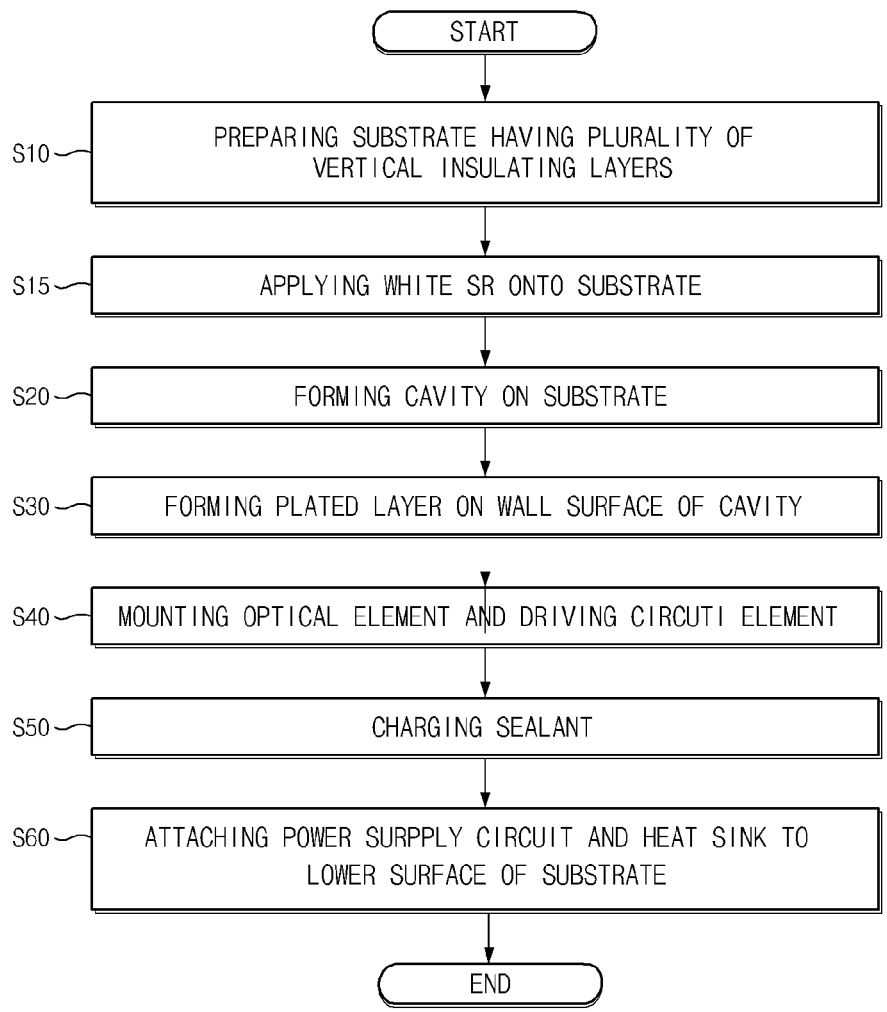
FIG. 4 is a flowchart explaining a method of manufacturing a substrate for an optical device according to the present invention.

FIG. 4 is a flowchart explaining a method of manufacturing a substrate for an optical device according to the present invention. As shown in FIG. 4, according to the method of manufacturing a substrate for an optical device of the present invention, first, in step 10 (S10), a substrate having two or more vertical insulating layers is provided in order to serially connect a plurality of optical elements and mount a driving circuit. Such a substrate may be prepared by the process shown in FIGS. 1A to 1D. Meanwhile, such a substrate for an optical device may be formed of a metal plate containing at least one of aluminum and copper having high thermal conductivity and electrical conductivity. Particularly, when the substrate for an optical device is formed of an aluminum plate, it is preferred that the process shown in FIGS. 1A to 1D be performed after anodizing the entire surface of the aluminum plate.

Figure 5A:
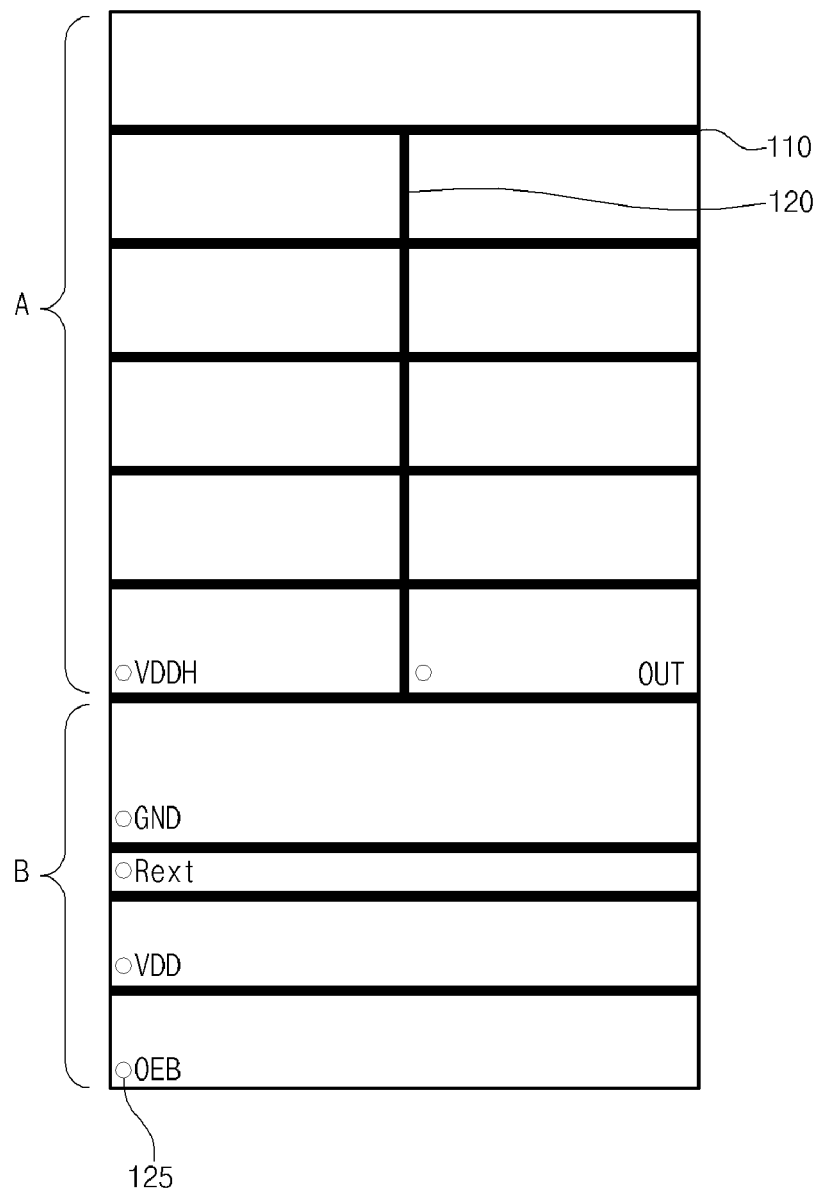
FIG. 5A is a plan view of a substrate for an optical device according to an embodiment of the present invention.

FIG. 5A is a plan view of a substrate for an optical device according to an embodiment of the present invention. That is, FIG. 5A shows a substrate for an optical device, corresponding to the optical device substrate of FIG. 3, wherein five optical elements are respectively disposed at the left and right rows thereof and are connected in series to each other. Therefore, the substrate 100 for an optical device is provided with five vertical insulating layers for electrically insulating the electrodes of vertically-disposed optical elements and four vertical insulating layers for electrically insulating a driving circuit, for example, a passive element such as a resistor (R) or a condenser (C) and the terminals of a driving IC (U1) (hereinafter, the total nine vertical insulating layers are referred to as "transverse vertical insulating layers 110"). Hereinafter, the substrate region in which optical elements are disposed is referred to as "an optical element substrate region" (A), and the substrate region in which a driving circuit is disposed is referred to as "a driving circuit substrate region" (B).

Meanwhile, optical elements of left and right, excluding the uppermost optical element, must be electrically insulated. For this purpose, the optical element substrate region (A) is longitudinally provided at the center thereof with a vertical insulating layer 120 (hereinafter, referred to as "a longitudinal vertical insulating layer" 120). Such a longitudinal vertical insulating layer 120 may be fabricated in the form of a slit gap cut by laser processing or in the form of a gap filled with an additional insulating material. Another method of forming the longitudinal vertical insulating layer 120 will be described later.

Moreover, in FIG. 5A, the lengths among the transverse vertical insulating layers 110 of the driving circuit substrate region (B) may be different from those among the transverse vertical insulating layers 110 of the optical element substrate region (A) depending on the size of the mounted passive element or driving IC and the intervals between terminals. In FIG. 5A, the reference numeral 125 indicates pinholes through which the optical elements and driving IC disposed on the upper surface of the substrate 100 for an optical device are electrically connected with the terminal pins of the power supply substrate attached to the lower surface of the substrate 100 for an optical device.

Figure 5B:
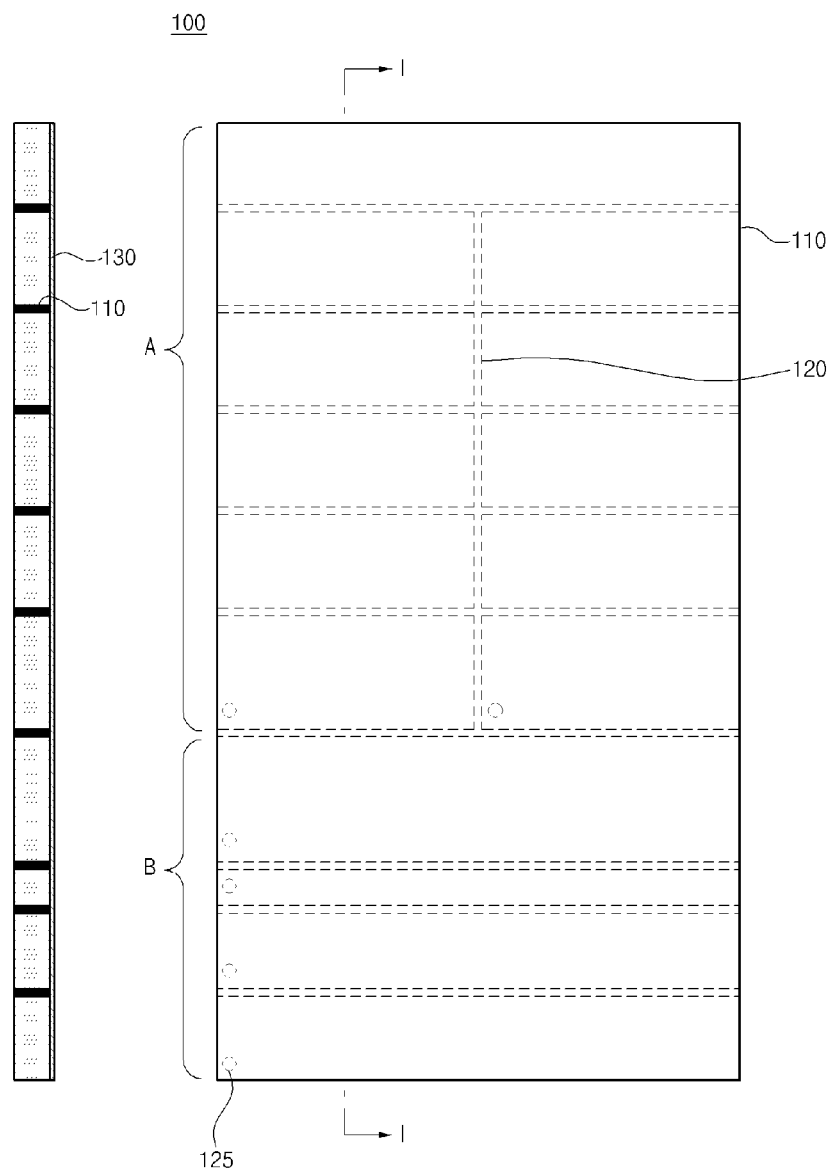
FIG. 5B shows a plan view of the substrate for an optical device, wherein a process of forming a cavity shown in FIG. 4 has been completed, and a sectional view thereof taken along the line I-I.

Next, in step 15 (S15), in order to improve a light distribution effect, white paint 130, for example, white soldering paste is applied on the substrate 100 for an optical device. FIG. 5B shows a plan view of the substrate 100 for an optical device, having been coated with white paint, and a sectional view thereof taken along the line I-I. This white paint 130 contributes to the reduction of a plating material in the following plating process.

Figure 5C:
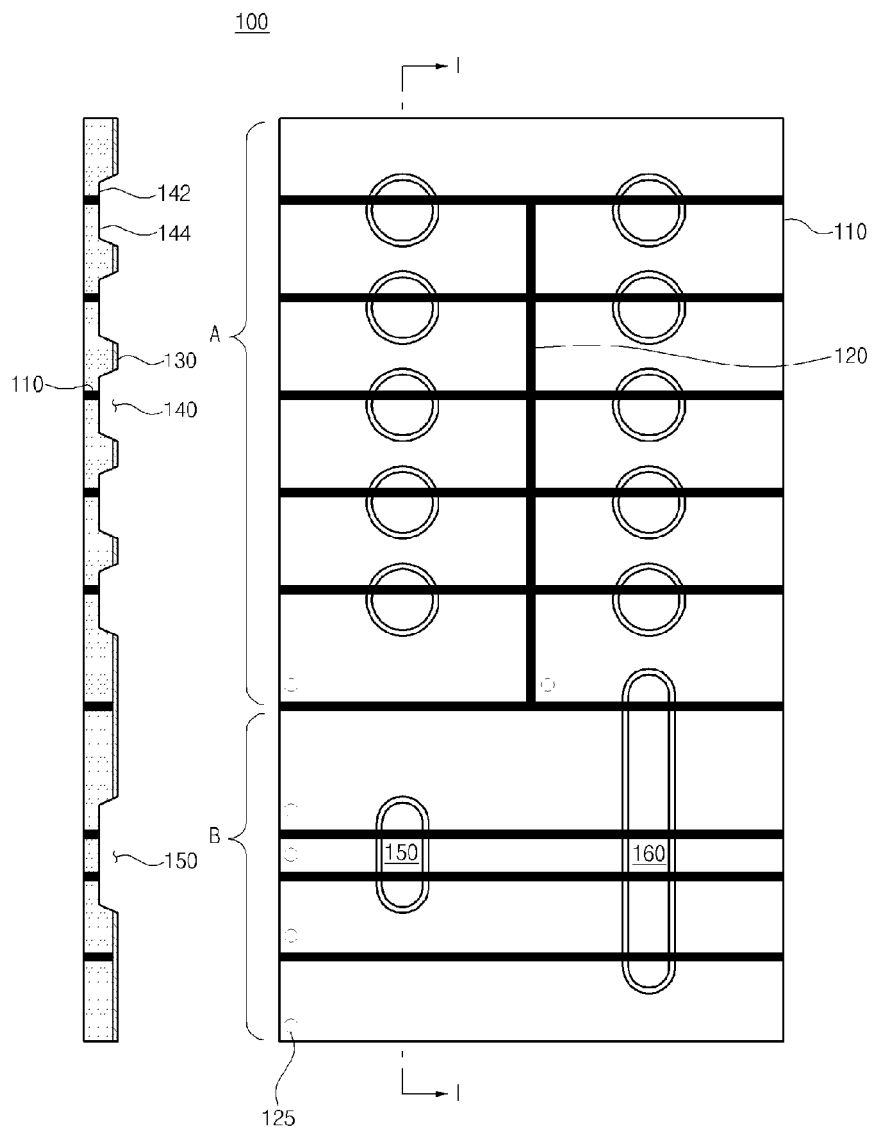
FIG. 5C shows a plan view of the substrate for an optical device, wherein a plating process shown in FIG. 4 has been completed, and a sectional view thereof taken along the line I-I.

Returning to FIG. 4, in step 20 (S20), cavities mounted with optical elements and a driving circuit are formed on the substrate 100 coated with white paint by cutting or etching. FIG. 5C shows a plan view of the substrate 100 for an optical device, having been formed with cavities, and a sectional view thereof taken along the line I-I. As shown in FIG. 5C, each of the cavities 140 for an optical element includes the transverse vertical insulating layer 110, and may be formed in the shape of a circular groove having a wide upper portion and a narrow lower portion in order to improve the reflective performance of light. Further, each of the cavities 140 may be formed such that its region in which an optical element to be placed with the transverse vertical insulating layer 110 therebetween has a larger area than its region to which only a wire is connected (hereinafter, the wire connection region is referred to as "a relative small-area region 142", and the optical element placed region is referred to as "a relative large-area region 144").

The cavities for a driving circuit may be formed into one or more long grooves disposed over the partial or entire length of the driving circuit substrate region (B) to include the transverse vertical insulating layer. In this embodiment, the cavity 150 for a passive element and the cavity 160 for a driving IC are separated from each other.

Figure 5D:
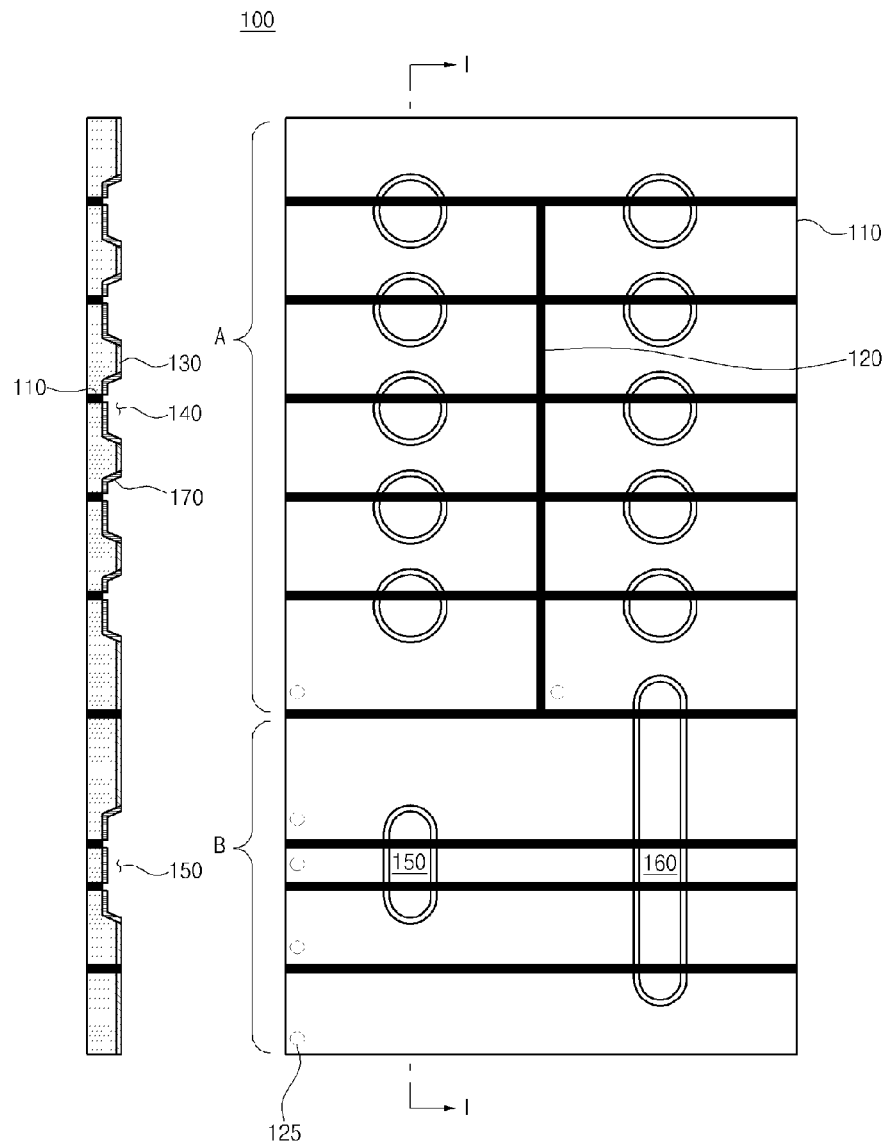
FIG. 5D shows a plan view of the substrate for an optical device, wherein a process of mounting an optical element and a driving circuit element shown in FIG. 4 has been completed, and a sectional view thereof taken along the line I-I.

Next, in step 30 (S30), in order to improve the light reflective performance or bonding performance of an optical element, the bottom surface and main wall surface of the cavity 140 for an optical element may be plated with a metal, for example, silver (Ag) to form a metal plated layer 170. This metal plated layer 170 may be formed by electrolytic plating. In this case, since the metal plated layer 170 is not formed on the transverse vertical insulating layer 110, the relative small-area region 142 and the relative large-area region 144 are insulated from each other with the transverse vertical insulating layer 110 in-between. The bottom surface of the cavity 150 for passive elements and the bottom surface of the cavity 160 for a driving IC may also be formed thereon with the metal plated layer in order to improve the bonding performance thereof. FIG. 5D shows a plan view of the substrate 100 for an optical device, having been plated with the metal, and a sectional view thereof taken along the line I-I.

Figure 5E:
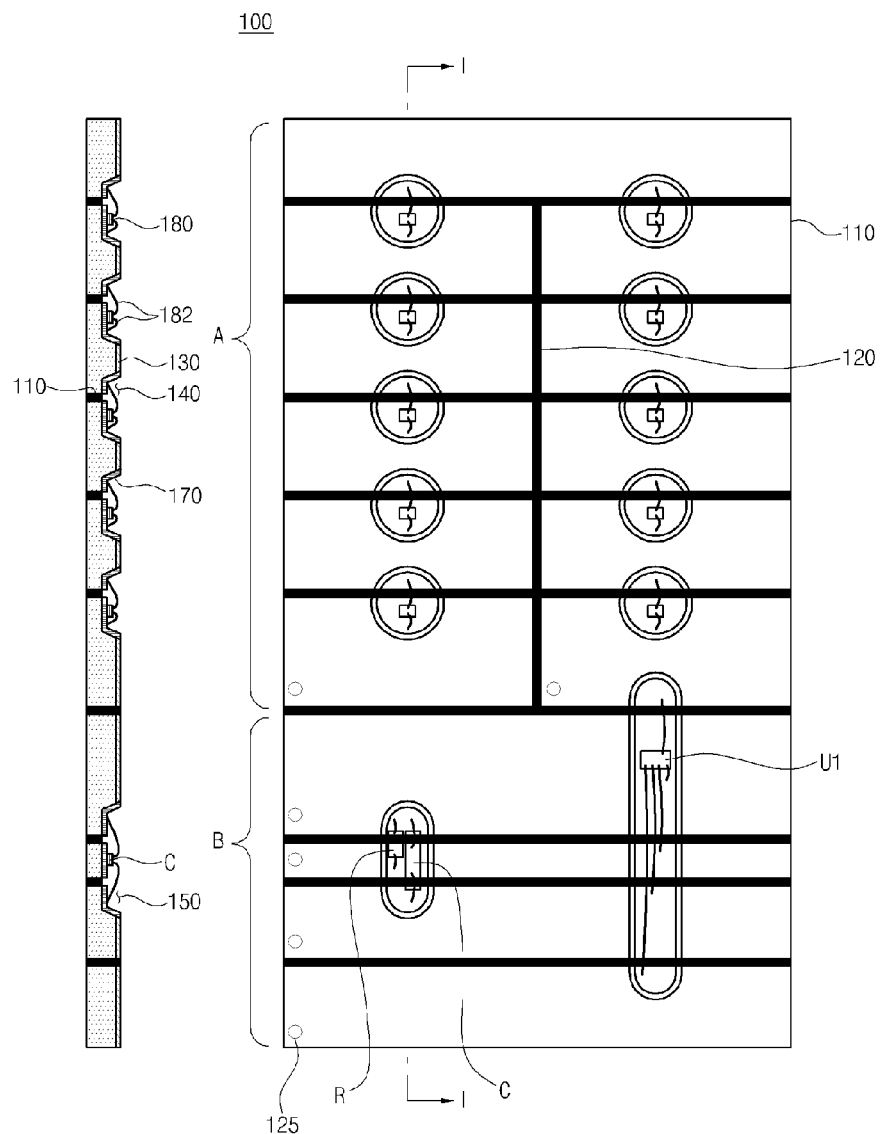
FIG. 5E shows a plan view of the substrate for an optical device, wherein a process of charging a sealant shown in FIG. 4 has been completed, and a sectional view thereof taken along the line I-I.

Returning to FIG. 4, in step 40 (S40), the cavity 140 for an optical element, the cavity 150 for a passive element and the cavity 160 for a driving IC are each mounted with optical elements 180 (D1-D10), passive elements such as a resistor (R) and a condenser (C) and a driving IC (U1). In this case, an optical element 180 is attached to the relative large-area region 144, and simultaneously any one of the two electrodes of the optical element 180, for example, an anode electrode is connected to the relative large-area region 144 through a wire 182, and a cathode electrode is connected to the relative small-area region 142 through a wire 182. Of course, when the optical element 180 is attached to the relative large-area region 144 by an attaching method for maintaining conductivity, for example, soldering, while exposing the anode electrode (or cathode electrode) of the optical element 180 to the bottom surface of the optical element 180, one wire, for example, only a wire for connecting the cathode electrode of the optical element 180 to the relative small-area region 142 may be required. Passive elements, such as a resistor (R) and condenser (C), and a driving IC (U1) may also be electrically connected with the substrate for an optical device by chip bonding or wire bonding. FIG. 5E shows a plan view of the substrate 100 for an optical device, having been mounted with optical elements and driving circuit elements, and a sectional view thereof taken along the line I-I.

Figure 5F:
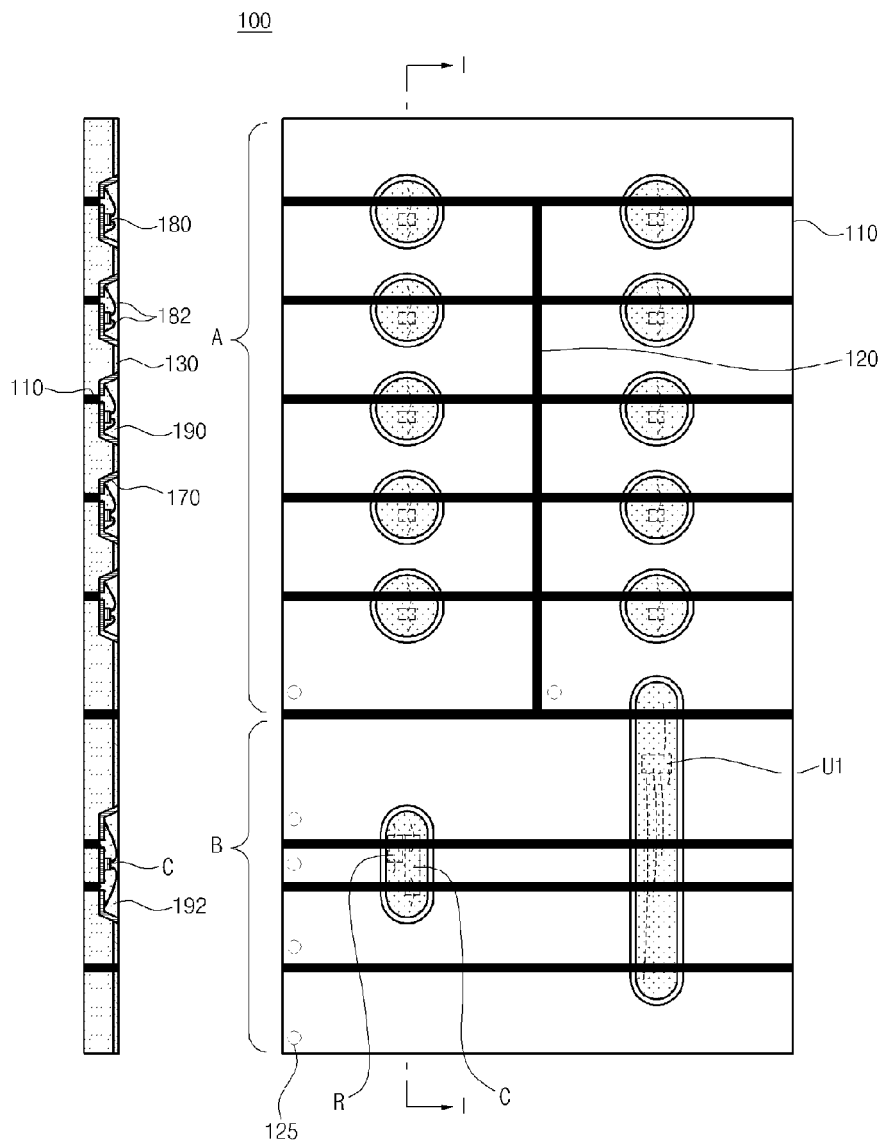
FIG. 5F shows a plan view of the substrate for an optical device, wherein a process of attaching a substrate for a power supply circuit has been completed, and a sectional view thereof taken along the line I-I.

Next, in step 50 (S50), each of the cavities 140, 150 and 160 is charged with a sealant 190 or 192. Particularly, the sealant 190 charged in the cavity 140 for an optical element may include a fluorescent material. FIG. 5F shows a plan view of the substrate 100 for an optical device, having been charged with a sealant, and a sectional view thereof taken along the line I-I.

Figure 5G:
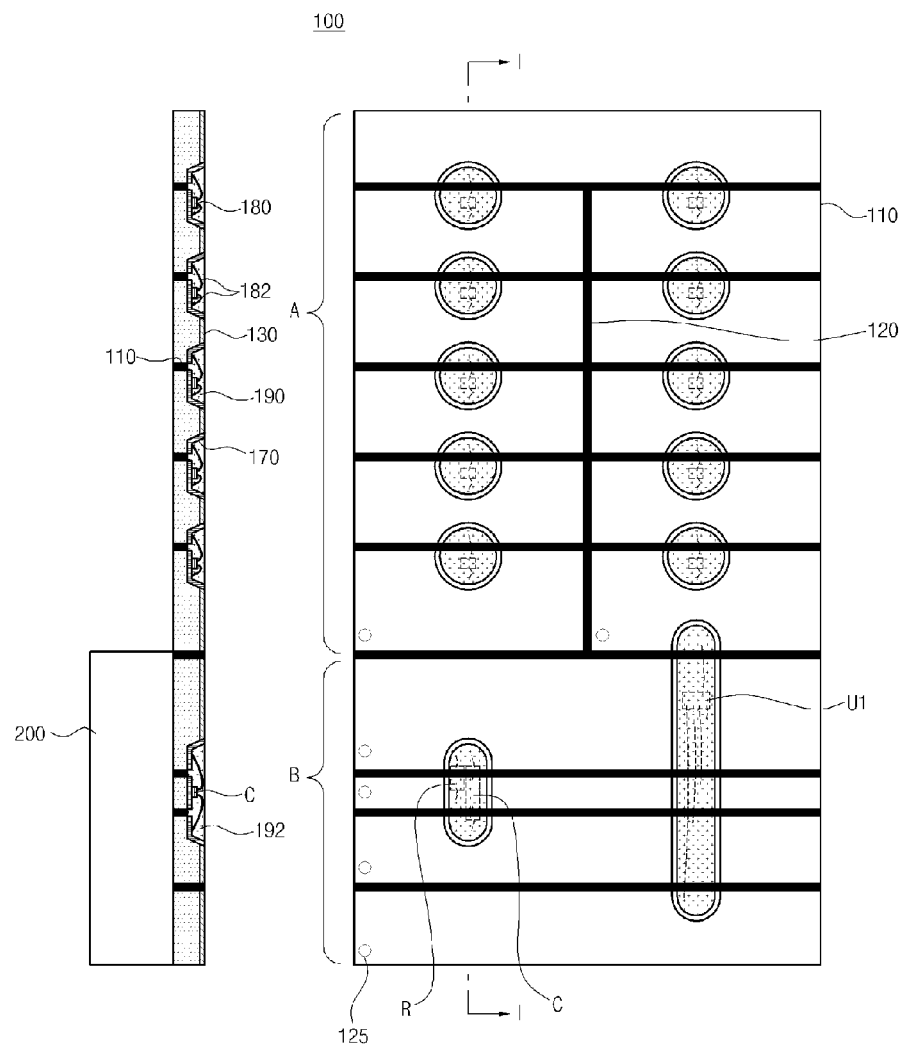
FIG. 5G shows a plan view of the substrate for an optical device, wherein a process of attaching a heat sink has been completed, and a sectional view thereof taken along the line I-I.
Figure 5H:
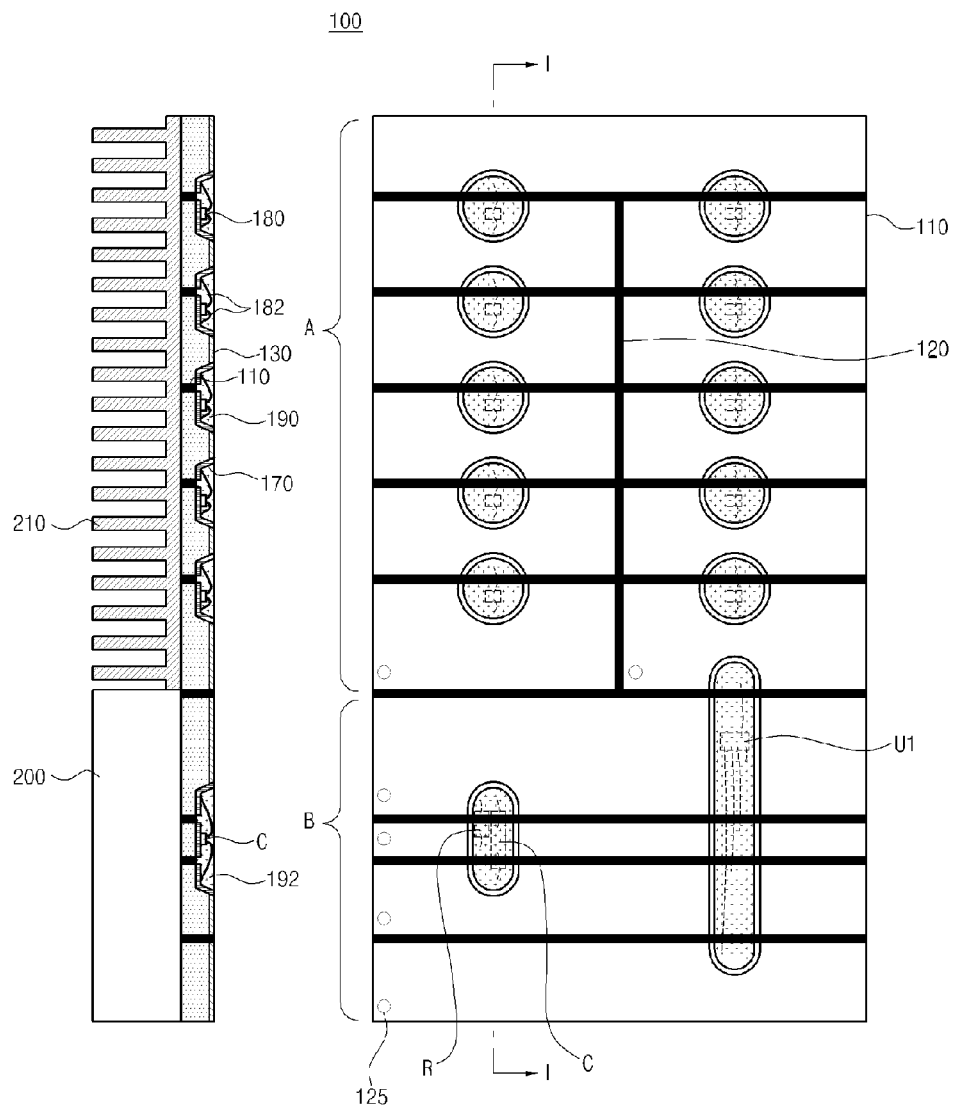
FIG. 5H shows a plan view of the substrate 100 for an optical device, having been attached with a heat sink, and a sectional view thereof taken along the line I-I.

Next, in step 60 (S60), the driving circuit substrate region (B) of the substrate 100 of an optical device is attached to the power supply circuit substrate 190 mounted with power supply circuit elements. In this case, necessary power terminals may be directly attached to the substrate for an optical device by soldering. Further, if necessary, a heat sink 210 may also be attached to the lower surface of the optical element substrate region (A). FIG. 5G shows a plan view of the substrate 100 for an optical device, having been attached with a power supply circuit substrate, and a sectional view thereof taken along the line I-I. FIG. 5H shows a plan view of the substrate 100 for an optical device, having been attached with a heat sink, and a sectional view thereof taken along the line I-I.

Figure 6:
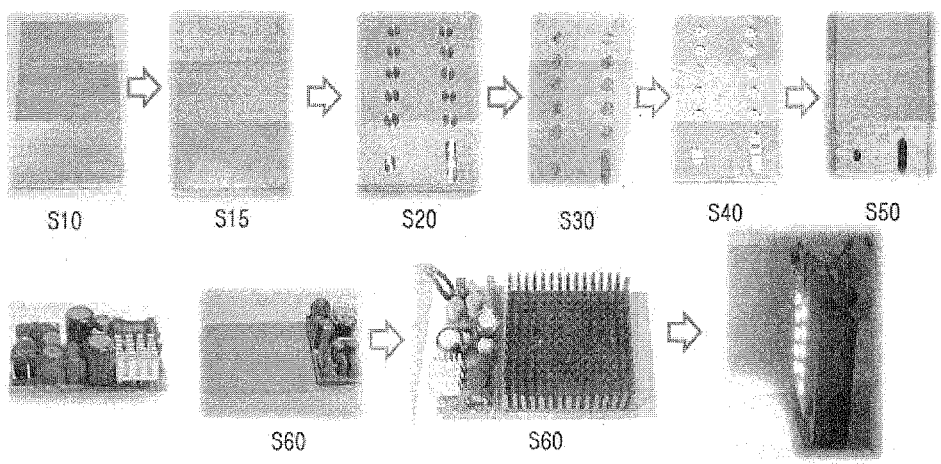
FIG. 6 is a photograph showing a process of manufacturing an optical device integrated with a driving circuit and a power supply circuit having the circuit configuration of FIG. 3.

FIG. 6 is a photograph showing a process of manufacturing an optical device integrated with a driving circuit and a power supply circuit having the circuit configuration of FIG. 3.

Figure 7:
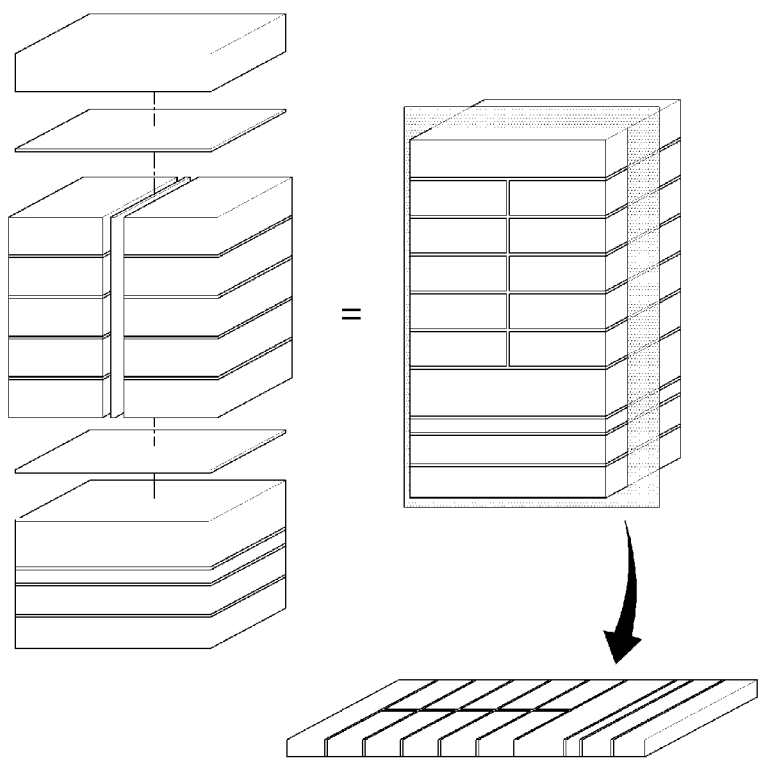
FIG. 7 is a perspective view explaining another method of manufacturing the substrate for the optical device shown in FIG. 3.

FIG. 7 is a perspective view explaining another method of manufacturing a substrate for the optical device shown in FIG. 3. As shown in FIG. 7, in the formation of a longitudinal vertical insulating layer provided on an optical element substrate region, the longitudinal vertical insulating layer may be formed by preparing a laminate constituting the optical element substrate region shown in FIG. 5A by the method of FIG. 1A and then longitudinally cutting the laminate into halves or by preparing two laminates each having a length ½ that of the optical element substrate region and then facing and attaching these two laminates to the upper surface of a driving circuit substrate region using an insulation film or an insulation adhesive. Next, the laminate prepared in this way is cut downward at regular widths, thus fabricating the substrate for an optical device shown in FIG. 5A.

Figure 8:
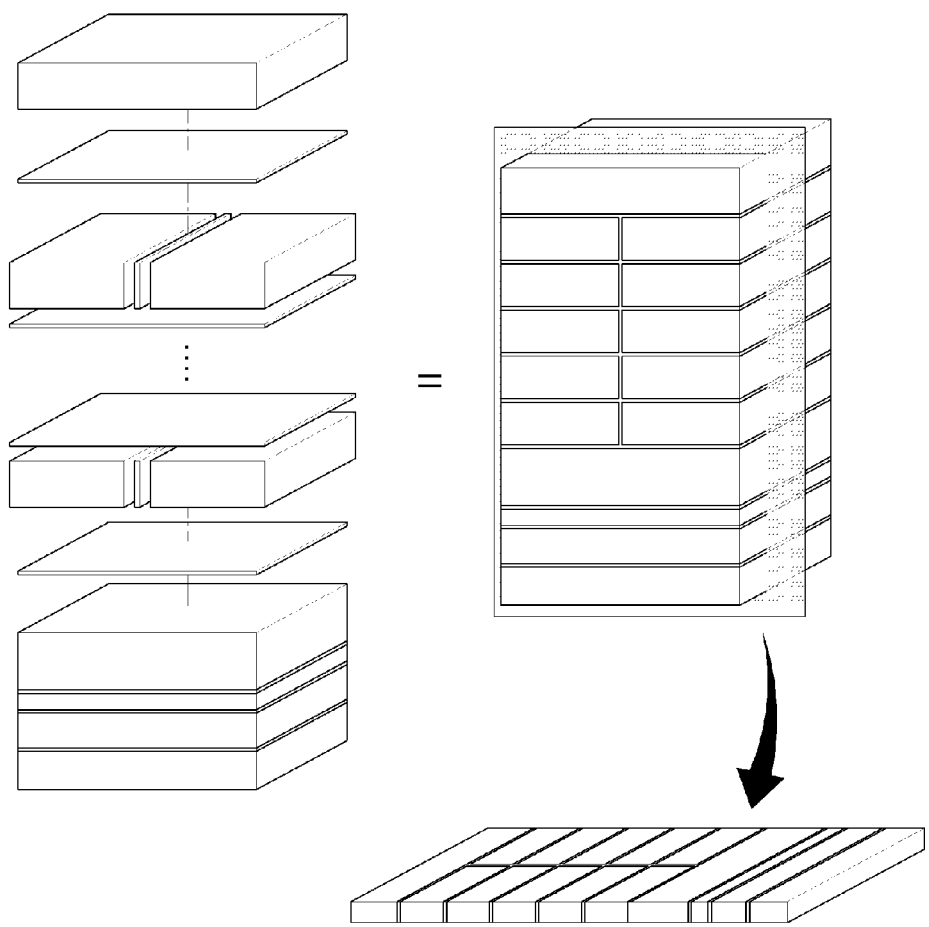
FIG. 8 is a perspective view explaining still another method of manufacturing the substrate for the optical device shown in FIG. 3.

FIG. 8 is a perspective view explaining still another method of manufacturing a substrate for the optical device shown in FIG. 3. As shown in FIG. 8, in this method, the longitudinal vertical insulating layer may be formed by preparing two metal plates each having a length ½ that of the optical element substrate region and then facing and attaching these two metal plates to the upper surface of a driving circuit substrate region using an insulation film or an insulation adhesive.

Figure 9:
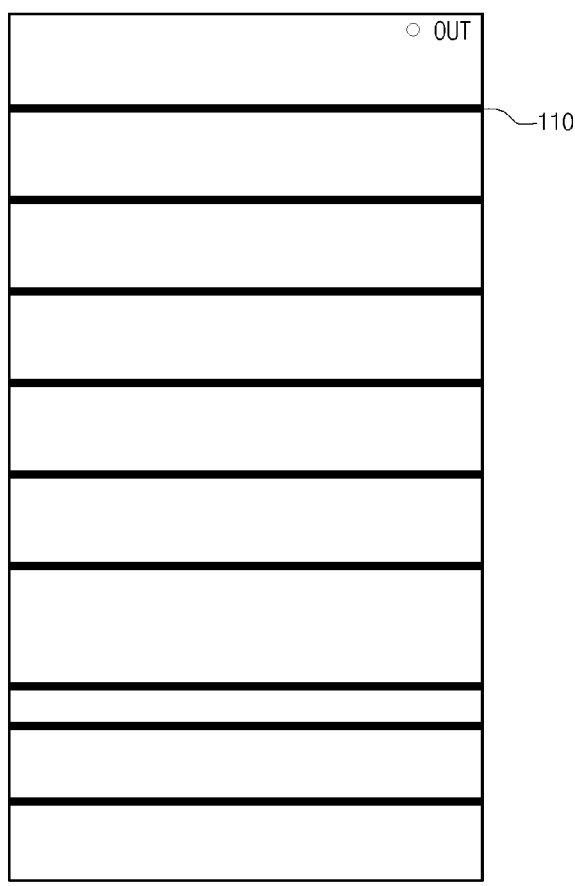
FIG. 9 is a plan view of an optical device according to another embodiment of the present invention.

FIG. 9 is a plan view of an optical device according to another embodiment of the present invention. The optical device of FIG. 9 includes ten optical elements. Since a substrate 100' for the optical device is not provided with a longitudinal vertical insulating layer, unlike the above-mentioned embodiment, it is configured such that five longitudinally-arranged optical elements are connected in series to each other, whereas other optical elements arranged at left and right rows are connected in parallel to each other. In this case, the output terminal (OUT) of a driving IC may be electrically connected to the uppermost raw of the optical element substrate region by cables.

Meanwhile, in the above-mentioned embodiments, each of the transverse vertical insulating layer and the longitudinal insulating layer may be composed of an anodized layer and an adhesive, an insulation film and an adhesive or an anodized layer, an insulation film and an adhesive, in the case of an aluminum substrate.

The optical device integrated with a driving circuit and a power supply circuit, the method of manufacturing an optical device substrate used therein, and the substrate thereof may be variously modified without departing from the scope and spirit of the invention. For example, the structure of the optical device may be modified such that all the five longitudinally-arranged optical elements, shown in FIG. 5B, are contained by one cavity having a rectangular groove shape.

What is claimed is:

1. An optical device integrated with a driving circuit and a power supply circuit, comprising:
   a substrate including a plurality of transverse vertical insulating layers vertically penetrating the substrate in a transverse direction,
   wherein the substrate comprises:
   an optical element substrate region including two or more of the plurality of transverse vertical insulating layers and mounted with a plurality of optical elements; and
   a driving circuit substrate region including at least one of the other transverse vertical insulating layers and mounted with a driving circuit element.

2. The optical device of claim 1, wherein the optical element substrate region includes at least one longitudinal vertical insulating layer vertically penetrating the substrate in a longitudinal direction.

3. The optical device of claim 1, wherein the optical element substrate region is configured such that at least one cavity for an optical element, including the vertical insulating layer, is formed to a predetermined depth from an upper surface thereof.

4. The optical device of claim 1, wherein the driving circuit substrate region is configured such that at least one cavity for a driving circuit, including the vertical insulating layer, is formed to a predetermined depth from an upper surface thereof, and is formed therein with a plurality of pinholes.

5. The optical device of claim 1, further comprising a power supply circuit substrate attached to the lower surface of the driving circuit substrate region.

6. The optical device of claim 5, further comprising a heat sink attached to the lower surface of the optical element substrate region.

7. A method of manufacturing a substrate for an optical device integrated with a driving circuit and a power supply circuit, comprising the steps of:

(a) laminating a plurality of metal plates to function as a driving circuit substrate region mounted with a driving circuit and interposing an insulating layer between the metal plates;

(b) laminating a plurality of metal plates to function as an optical element substrate region mounted with an optical element, the vertical length of the optical element substrate region being the same as that of the driving circuit substrate region, and interposing an insulating layer between the metal plates to form two optical element substrate blocks, facing the two optical element substrate blocks each other in a traverse direction, and then attaching the insulating layer onto the uppermost metal plate of the driving circuit substrate region;

(c) laminating a metal plate to function as a substrate for connecting the optical element substrate, the horizontal and vertical lengths of the metal plate being the same as those of the metal plate for the driving circuit substrate, onto the uppermost metal plate of the optical element substrate region with the insulating layer disposed therebetween, thus preparing an intermediate product; and (d) vertically cutting the intermediate product to have a predetermined width in a length direction.

8. A method of manufacturing a substrate for an optical device integrated with a driving circuit and a power supply circuit, comprising the steps of:

(h) laminating a plurality of metal plates to function as a driving circuit substrate region mounted with a driving circuit and interposing an insulating layer between the metal plates;

(i) laminating two metal plates to function as an optical element substrate region mounted with an optical element, the vertical length of the optical element substrate region being the same as that of the driving circuit substrate region, and interposing an insulating layer between the two metal plates, facing the two metal plates each other in a traverse direction, and then attaching the metal plates to each other in a multilayer fashion with the insulating layer disposed therebetween;

(j) laminating a metal plate to function as a substrate for connecting the optical element substrate, the horizontal and vertical lengths of the metal plate being the same as those of the metal plate for the driving circuit substrate, onto the uppermost metal plate of the optical element substrate region with the insulating layer disposed therebetween, thus preparing an intermediate product; and (k) vertically cutting the intermediate product to have a predetermined width in a length direction.

9. The optical device of claim 2, further comprising a power supply circuit substrate attached to the lower surface of the driving circuit substrate region.

10. The optical device of claim 3, further comprising a power supply circuit substrate attached to the lower surface of the driving circuit substrate region.

11. The optical device of claim 4, further comprising a power supply circuit substrate attached to the lower surface of the driving circuit substrate region.

* * * * *